United States Patent
Pradhan et al.

(10) Patent No.: US 9,853,156 B2
(45) Date of Patent: *Dec. 26, 2017

(54) SOURCE/DRAIN CONTACTS FOR NON-PLANAR TRANSISTORS

(71) Applicant: Intel Corporation, Santa Clara, CA (US)

(72) Inventors: Sameer S. Pradhan, Portland, OR (US); Subhash M. Joshi, Hillsboro, OR (US); Jin-Sung Chun, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/618,414

(22) Filed: Feb. 10, 2015

(65) Prior Publication Data

US 2015/0155385 A1    Jun. 4, 2015

Related U.S. Application Data

(63) Continuation of application No. 13/992,550, filed as application No. PCT/US2011/054479 on Oct. 1, 2011, now Pat. No. 8,981,435.

(51) Int. Cl.
*H01L 29/78*    (2006.01)
*H01L 21/02*    (2006.01)
(Continued)

(52) U.S. Cl.
CPC .......... *H01L 29/785* (2013.01); *H01L 21/02* (2013.01); *H01L 21/02532* (2013.01);
(Continued)

(58) Field of Classification Search
CPC ............ H01L 29/66795; H01L 29/785; H01L 29/41791
See application file for complete search history.

(56) References Cited

U.S. PATENT DOCUMENTS 5,399,415 A    3/1995    Chen et al.
5,846,621 A    12/1998    Nagamatsu
(Continued)

FOREIGN PATENT DOCUMENTS

CN    1598026 A    3/2005
CN    1846313 A    10/2006
(Continued)

OTHER PUBLICATIONS

Office Action received for Taiwan Patent Application No. 101133821, mailed on Dec. 25, 2014, 7 pages of English Translation and 9 pages of Taiwan Office Action.
(Continued)

*Primary Examiner* — Mohsen Ahmadi
*Assistant Examiner* — Scott Stowe
(74) *Attorney, Agent, or Firm* — Green, Howard & Mughal LLP

(57) ABSTRACT

The present description relates to the field of fabricating microelectronic devices having non-planar transistors. Embodiments of the present description relate to the formation of source/drain contacts within non-planar transistors, wherein a titanium-containing contact interface may be used in the formation of the source/drain contact with a discreet titanium silicide formed between the titanium-containing interface and a silicon-containing source/drain structure.

16 Claims, 13 Drawing Sheets

(51) Int. Cl.

| | | |
|---|---|---|
| *H01L 23/48* | (2006.01) | |
| *H01L 29/66* | (2006.01) | |
| *H01L 29/417* | (2006.01) | |
| *H01L 21/283* | (2006.01) | |
| *H01L 21/3205* | (2006.01) | |
| *H01L 29/16* | (2006.01) | |
| *H01L 29/45* | (2006.01) | |

(52) U.S. Cl.
CPC ...... *H01L 21/283* (2013.01); *H01L 21/32053* (2013.01); *H01L 23/48* (2013.01); *H01L 29/16* (2013.01); *H01L 29/41791* (2013.01); *H01L 29/456* (2013.01); *H01L 29/6656* (2013.01); *H01L 29/66545* (2013.01); *H01L 29/66666* (2013.01); *H01L 29/66795* (2013.01); *H01L 29/78* (2013.01); *H01L 29/7851* (2013.01); *H01L 2924/0002* (2013.01)

(56) References Cited

U.S. PATENT DOCUMENTS

| | | | |
|---|---|---|---|
| 6,030,692 | A | 2/2000 | Auger |
| 6,136,697 | A | 10/2000 | Wu |
| 6,331,481 | B1 | 12/2001 | Stamper et al. |
| 6,617,226 | B1 | 9/2003 | Suguro et al. |
| 6,720,261 | B1 | 4/2004 | Anderson et al. |
| 7,456,471 | B2 | 11/2008 | Anderson et al. |
| 7,528,025 | B2 | 5/2009 | Brask et al. |
| 7,936,025 | B2 | 5/2011 | Chau et al. |
| 9,177,867 | B2 | 11/2015 | Pradhan et al. |
| 9,202,699 | B2 | 12/2015 | Rosenbaum et al. |
| 2002/0130372 | A1 | 9/2002 | Kwon et al. |
| 2002/0155637 | A1 | 10/2002 | Lee |
| 2003/0035947 | A1 | 2/2003 | Heberger et al. |
| 2004/0161924 | A1 | 8/2004 | Chen et al. |
| 2004/0203211 | A1 | 10/2004 | Yang et al. |
| 2005/0019993 | A1 | 1/2005 | Lee et al. |
| 2005/0023133 | A1 | 2/2005 | Lippitt et al. |
| 2005/0037557 | A1 | 2/2005 | Doczy et al. |
| 2005/0051854 | A1 | 3/2005 | Cabral et al. |
| 2005/0093081 | A1 | 5/2005 | Belyansky et al. |
| 2006/0006466 | A1 | 1/2006 | Iinuma |
| 2006/0046449 | A1 | 3/2006 | Liaw |
| 2006/0071275 | A1 | 4/2006 | Brask et al. |
| 2006/0088967 | A1 | 4/2006 | Hsiao et al. |
| 2006/0099783 | A1 | 5/2006 | Gluschenkov et al. |
| 2006/0157749 | A1 | 7/2006 | Okuno |
| 2006/0175669 | A1 | 8/2006 | Kim et al. |
| 2006/0189058 | A1 | 8/2006 | Lee et al. |
| 2006/0223290 | A1 | 10/2006 | Belyansky et al. |
| 2007/0066184 | A1 | 3/2007 | Nagamoto et al. |
| 2007/0111435 | A1 | 5/2007 | Kim et al. |
| 2007/0148881 | A1 | 6/2007 | Tseng et al. |
| 2007/0161170 | A1* | 7/2007 | Orlowski .......... H01L 29/41791 438/197 |
| 2008/0001187 | A1 | 1/2008 | Booth et al. |
| 2008/0014710 | A1 | 1/2008 | Bian et al. |
| 2008/0067613 | A1 | 3/2008 | Anderson et al. |
| 2008/0090397 | A1 | 4/2008 | Brask et al. |
| 2008/0233699 | A1 | 9/2008 | Booth et al. |
| 2008/0265321 | A1 | 10/2008 | Yu et al. |
| 2008/0283906 | A1 | 11/2008 | Bohr et al. |
| 2008/0290380 | A1 | 11/2008 | Sheu et al. |
| 2009/0032887 | A1 | 2/2009 | Jang et al. |
| 2009/0081836 | A1 | 3/2009 | Liu et al. |
| 2009/0142991 | A1 | 6/2009 | Moon |
| 2009/0246973 | A1 | 10/2009 | Clark |
| 2009/0321841 | A1 | 12/2009 | Hoentschel et al. |
| 2010/0032728 | A1 | 2/2010 | Hao et al. |
| 2010/0048007 | A1 | 2/2010 | Lee et al. |
| 2010/0105215 | A1 | 4/2010 | Sugawara et al. |
| 2010/0133614 | A1 | 6/2010 | Beyer et al. |
| 2010/0155842 | A1 | 6/2010 | Anderson et al. |
| 2010/0270627 | A1 | 10/2010 | Chang et al. |
| 2011/0034026 | A1 | 2/2011 | Sunayama et al. |
| 2011/0108930 | A1 | 5/2011 | Cheng et al. |
| 2011/0147812 | A1 | 6/2011 | Steigerwald et al. |
| 2011/0147831 | A1 | 6/2011 | Steigerwald et al. |
| 2011/0147851 | A1 | 6/2011 | Thomas et al. |
| 2011/0147858 | A1 | 6/2011 | Lim et al. |
| 2011/0151250 | A1 | 6/2011 | Yasuda et al. |
| 2011/0156107 | A1 | 6/2011 | Bohr et al. |
| 2011/0204505 | A1 | 8/2011 | Pagaila et al. |
| 2011/0217541 | A1 | 9/2011 | Shimano et al. |
| 2011/0237062 | A1 | 9/2011 | Na et al. |
| 2011/0272739 | A1 | 11/2011 | Lee et al. |
| 2011/0281509 | A1 | 11/2011 | Tanaka et al. |
| 2012/0001266 | A1 | 1/2012 | Lim et al. |
| 2012/0034449 | A1 | 2/2012 | Imamura et al. |
| 2012/0058616 | A1 | 3/2012 | Ahn et al. |
| 2012/0313170 | A1 | 12/2012 | Chang et al. |
| 2013/0062669 | A1 | 3/2013 | Chen et al. |
| 2013/0065371 | A1 | 3/2013 | Wei et al. |
| 2013/0248952 | A1 | 9/2013 | Rosenbaum et al. |
| 2013/0334713 | A1 | 12/2013 | Xu et al. |
| 2014/0117425 | A1 | 5/2014 | Pradhan et al. |
| 2015/0041926 | A1 | 2/2015 | Pradhan et al. |
| 2016/0035724 | A1 | 2/2016 | Pradhan et al. |
| 2016/0035725 | A1 | 2/2016 | Pradhan et al. |
| 2016/0049499 | A1 | 2/2016 | Rosenbaum et al. |

FOREIGN PATENT DOCUMENTS

| | | |
|---|---|---|
| CN | 1848454 A | 10/2006 |
| CN | 1925118 A | 3/2007 |
| CN | 1930668 A | 3/2007 |
| CN | 1947242 A | 4/2007 |
| CN | 101006579 A | 7/2007 |
| CN | 101584025 A | 11/2009 |
| CN | 101661957 A | 3/2010 |
| CN | 101764158 A | 6/2010 |
| CN | 101803005 A | 8/2010 |
| CN | 101908499 A | 12/2010 |
| CN | 102034758 A | 4/2011 |
| CN | 102104061 A | 6/2011 |
| JP | 2000031291 A | 1/2000 |
| JP | 2002-184981 A | 6/2002 |
| JP | 2004-128314 A | 4/2004 |
| JP | 2010-050215 A | 3/2010 |
| KR | 10-2002-0056285 A | 7/2002 |
| KR | 10-2004-0050519 A | 6/2004 |
| KR | 10-0585178 B1 | 5/2006 |
| KR | 10-0653711 B1 | 12/2006 |
| KR | 10-2007-0122319 A | 12/2007 |
| KR | 10-2008-0021918 A | 3/2008 |
| KR | 10-2009-0012793 A | 2/2009 |
| TW | 200741982 A | 11/2007 |
| TW | 201110324 A | 3/2011 |
| TW | 201123448 A | 7/2011 |
| TW | 201208078 A | 2/2012 |
| TW | 201236153 A | 9/2012 |
| WO | 2008/053008 A2 | 5/2008 |
| WO | 2011/087571 A1 | 7/2011 |
| WO | 2011/090571 A2 | 7/2011 |
| WO | 2013/048449 A1 | 4/2013 |
| WO | 2013/048516 A1 | 4/2013 |
| WO | 2013/048524 A1 | 4/2013 |
| WO | 2013/085490 A1 | 6/2013 |
| WO | 2013/095527 A1 | 6/2013 |

OTHER PUBLICATIONS

Office Action received for Taiwan Patent Application No. 101133821, mailed on Aug. 6, 2014, 7 pages of English Translation and 9 pages of Taiwan Office Action.

Office Action received for Japanese Patent Application No. 2014-533283, mailed on Feb. 10, 2015, 2 pages of English Translation and 1 page of Japanese Office Action.

International Preliminary Report on Patentability and Written Opinion received for PCT Patent Application No. PCT/US2011/054294, mailed on Apr. 10, 2014, 5 pages.

(56) References Cited

OTHER PUBLICATIONS

International Search Report and Written Opinion received for PCT Patent Application No. PCT/US2011/054294, mailed on May 15, 2012, 8 pages.
International Preliminary Report on Patentability and Written Opinion received for PCT Patent Application No. PCT/US2011/054464, mailed on Apr. 10, 2014, 4 pages.
International Search Report and Written Opinion received for PCT Patent Application No. PCT/US2011/054464, mailed on May 15, 2012, 9 pages.
International Preliminary Report on Patentability and Written Opinion received for PCT Patent Application No. PCT/US2011/054479, mailed on Apr. 10, 2014, 6 pages.
International Search Report and Written Opinion received for PCT Patent Application No. PCT/US2011/054479, mailed on May 16, 2012, 9 pages.
International Preliminary Report on Patentability and Written Opinion received for PCT Patent Application No. PCT/US2011/063433, mailed on Jun. 19, 2014, 10 pages.
International Search Report and Written Opinion received for PCT Patent Application No. PCT/US2011/063433, mailed on Jul. 20, 2012, 9 pages.
International Preliminary Report on Patentability and Written Opinion received for PCT Patent Application No. PCT/US2011/066921, mailed on Jul. 3, 2014, 8 pages.
International Search Report and Written Opinion received for PCT Patent Application No. PCT/US2011/066921, mailed on Sep. 27, 2012, 11 pages.
Office Action received for Korean Patent Application No. 10-2014-7007165, mailed on Apr. 14, 2015, 3 page of English Translation and 5 pages of Korean Office Action.
Office Action received for Korean Patent Application No. 10-2014-7007872, mailed on Apr. 28, 2015, 4 page of English Translation and 5 pages of Korean Office Action.
Office Action received for Taiwan Patent Application No. 101134489, mailed on May 1, 2015, 2 pages of Taiwan Office Action and 1 page of Search Report.
Office Action received for Taiwan Patent Application No. 101135607, mailed on May 8, 2015, 5 pages of Taiwan Office Action and 1 page of English Search report.
Extended European Search Report received for European Patent Application No. 11873428.4, mailed on Jul. 8, 2015, 9 pages.
Extended European Search Report received for European Patent Application No. 11873523.2, mailed on May 18, 2015, 8 pages.
Notice of Allowance received for Taiwan Patent Application No. 101134489, dated Aug. 26, 2015, 2 pages of Taiwan Notice of Allowance and 1 page of English Translation.
Notice of Allowance received for Taiwan Patent Application No. 101135607, dated Aug. 26, 2015, 2 pages of Taiwan Notice of Allowance and 1 page of English Translation.
Office Action received for Korean Patent Application No. 10-2014-7007165, dated Dec. 18, 2015, 5 pages of English Translation and 5 pages of Korean Office Action.
Office Action received for Korean Patent Application No. 10-2014-7007165, dated Oct. 19, 2015, 9 pages of English Translation and 3 pages of Korean Office Action.
Office Action received for Korean Patent Application No. 10-2015-7027031, dated Nov. 18, 2015, 5 pages of English Translation and 6 pages of Korean Office Action.
Office Action received for Korean Patent Application No. 10-2014-7007872, dated Feb. 4, 2016, 4 page of English Translation only.
Office Action received for Taiwan Patent Application No. 101144138, dated Feb. 17, 2016, 6 pages of Taiwan Office Action and 1 page English Search report.
Office Action received for Chinese Patent Application No. 201180073728.1, dated Dec. 2, 2015, 9 pages of English Translation and 8 pages of Chinese Office Action.
Office Action received for Chinese Patent Application No. 201180073809.1, dated Dec. 28, 2015, 8 pages of Chinese Office Action.
Office Action received for Taiwan Patent Application No. 101133821, dated May 19, 2016, 8 pages of English Translation and 5 pages of Taiwan Office Action.
Office Action received for German Patent Application No. 112011105925.6, dated Feb. 29, 2016, 4 pages of English Translation and 4 pages of German Office Action.
Office Action received for Chinese Patent Application No. 201180075347.7, dated Mar. 23, 2016, 10 pages of Chinese Office Action including Search Report.
Final Office Action received for Korean Patent Application No. 10-2014-7007872, dated Aug. 8, 2016, 5 pages of Korean Office Action including 2 pages of English Translation.
Notice of Allowance received for Chinese Patent Application No. 201180073809.1, dated Aug. 8, 2016, 4 pages of Notice of Allowance including 2 pages of English Translation.
Notice of Allowance received for Korean Patent Application No. 10-2014-7007872, dated Sep. 6, 2016, 3 pages of Notice of Allowance Only.
Office Action and Search Report received for Chinese Patent Application No. 201180074516.5, dated Sep. 38, 2016, 21 pages of Chinese Office Action including 12 pages of English Translation.
Notice of Allowance received for Chinese Patent Application No. 201180075347.7, dated Aug. 24, 2016, 4 pages of Chinese Office Action including 2 pages of English Translation.
Notice of Allowance received for Taiwan Patent Application No. 101144138, dated Jul. 20, 2016, 3 pages of Notice of Allowance including 1 page of English Translation.
Office Action received for Korean Patent Application No. 10-2015-7027031, dated Jul. 28, 2016, 5 pages of Office Action including 2 pages of English Translation.
Office Action received for Korean Patent Application No. 10-2015-7027031, dated Jun. 10, 2016, 5 pages of Office Action including 2 pages of English Translation.
Office Action received for Chinese Patent Application No. 201180073728.1, dated Jul. 5, 2016, 24 pages of Office Action including 13 pages of English Translation.
Office Action and Search Report received for Taiwanese Patent Application No. 104131442, dated Sep. 22, 2016, 3 pages of Taiwanese Office Action only.
Office Action received for Korean Patent Application No. 10-2015-7015842, dated Sep. 21, 2016, 5 pages of Korean Office Action and 1 page of English Translated Summary of Office Action.
Notice of Allowance received for Taiwan Patent Application No. 101133821, dated Aug. 24, 2016, 2 pages of Notice of Allowance Only.
Office Action received for Chinese Patent Application No. 201180074516.5, dated Dec. 16, 2016, 21 pages (12 pages of English Translation and 9 pages of Chinese Office Action).
Office Action and Search Report received for Taiwan Patent Application No. 104131438, dated Feb. 18, 2017, 3 pages of Taiwan Office Action and Search Report only.
Notice of Allowance received for Taiwan Patent Application No. 104131438, dated Apr. 28, 2017, 3 pages of NOA including 1 page of English Translation.
Office Action received for Chinese Patent Application No. 201180074516.5, dated Apr. 6, 2017, 22 pages of Chinese Office Action including 14 pages of English Translation.
Office Action received for Chinese Patent Application No. 201180074516.5, dated Jan. 26, 2016, 17 pages of English Translation and 10 pages of Chinese Office Action.

\* cited by examiner

SOURCE/DRAIN CONTACTS FOR NON-PLANAR TRANSISTORS

CROSS REFERENCE TO RELATED APPLICATIONS

The present application claims priority to U.S. patent application Ser. No. 13/992,550, filed Oct. 1, 2011, which in turn claims priority to International (PCT) Patent Application serial number PCT/US2011/054479, filed Oct. 1, 2011.

BACKGROUND

Embodiments of the present description generally relate to the field of microelectronic device fabrication and, more particularly, to the fabrication of source/drain contacts within non-planar transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
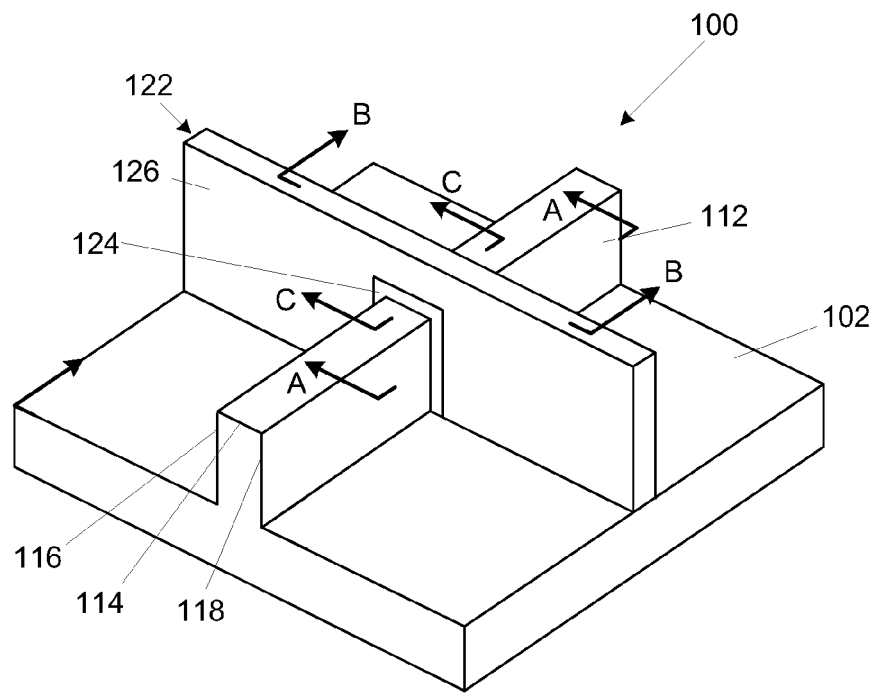
FIG. 1 is a perspective view of a non-planar transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In the fabrication of non-planar transistors, such as tri-gate transistors and FinFETs, non-planar semiconductor bodies may be used to form transistors capable of full depletion with very small gate lengths (e.g., less than about 30 nm). These semiconductor bodies are generally fin-shaped and are, thus, generally referred to as transistor "fins". For example in a tri-gate transistor, the transistor fins have a top surface and two opposing sidewalls formed on a bulk semiconductor substrate or a silicon-on-insulator substrate. A gate dielectric may be formed on the top surface and sidewalls of the semiconductor body and a gate electrode may be formed over the gate dielectric on the top surface of the semiconductor body and adjacent to the gate dielectric on the sidewalls of the semiconductor body. Thus, since the gate dielectric and the gate electrode are adjacent to three surfaces of the semiconductor body, three separate channels and gates are formed. As there are three separate channels formed, the semiconductor body can be fully depleted when the transistor is turned on. With regard to finFET transistors, the gate material and the electrode only contact the sidewalls of the semiconductor body, such that two separate channels are formed (rather than three in tri-gate transistors).

Embodiments of the present description relate to the formation of source/drain contacts within non-planar transistors, wherein a titanium-containing contact interface may be used in the formation of the source/drain contact with a discreet titanium silicide formed between the titanium-containing interface and a silicon-containing source/drain structure.

FIG. 1 is a perspective view of a non-planar transistor 100, including at least one gate formed on at least one transistor fin, which are formed on a microelectronic substrate 102. In an embodiment of the present disclosure, the microelectronic substrate 102 may be a monocrystalline silicon substrate. The microelectronic substrate 102 may also be other types of substrates, such as silicon-on-insulator ("SOI"), germanium, gallium arsenide, indium antimonide, lead telluride, indium arsenide, indium phosphide, gallium arsenide, gallium antimonide, and the like, any of which may be combined with silicon.

The non-planar transistor, shown as a tri-gate transistor, may include at least one non-planar transistor fin 112. The non-planar transistor fin 112 may have a top surface 114 and a pair of laterally opposite sidewalls, sidewall 116 and opposing sidewall 118, respectively.

As further shown in FIG. 1, at least one non-planar transistor gate 122 may be formed over the non-planar transistor fin 112. The non-planar transistor gate 122 may be fabricated by forming a gate dielectric layer 124 on or adjacent to the non-planar transistor fin top surface 114 and on or adjacent to the non-planar transistor fin sidewall 116 and the opposing non-planar transistor fin sidewall 118. A gate electrode 126 may be formed on or adjacent the gate dielectric layer 124. In one embodiment of the present disclosure, the non-planar transistor fin 112 may run in a direction substantially perpendicular to the non-planar transistor gate 122.

The gate dielectric layer 124 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 124 can be formed by well-known techniques, such as by conformally depositing a gate dielectric material and then patterning the gate dielectric material with well-known photolithography and etching techniques, as will be understood to those skilled in the art.

The gate electrode 126 can be formed of any suitable gate electrode material. In an embodiment of the present disclosure, the gate electrode 126 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 126 can be formed by well-known techniques, such as by blanket depositing a gate electrode material and then patterning the gate electrode material with well-known photolithography and etching techniques, as will be understood to those skilled in the art.

A source region and a drain region (not shown in FIG. 1) may be formed in the non-planar transistor fin 112 on opposite sides of the gate electrode 126. In one embodiment, the source and drain regions may be formed by doping the non-planar transistor fins 112, as will be understood to those skilled in the art. In another embodiment, the source and drain regions may be formed by removing portions of the non-planar transistor fins 112 and replacing these portions with appropriate material(s) to form the source and drain regions, as will be understood to those skilled in the art.

FIGS. 2-26 illustrate side cross-sectional view of one embodiment of fabricating a non-planar transistor, wherein FIGS. 2-5 are views along arrows A-A and B-B of FIG. 1, FIGS. 6-15 are views along arrows A-A of FIG. 1, and FIG. 16-26 are views along arrows C-C of FIG. 1.

Figure 2:
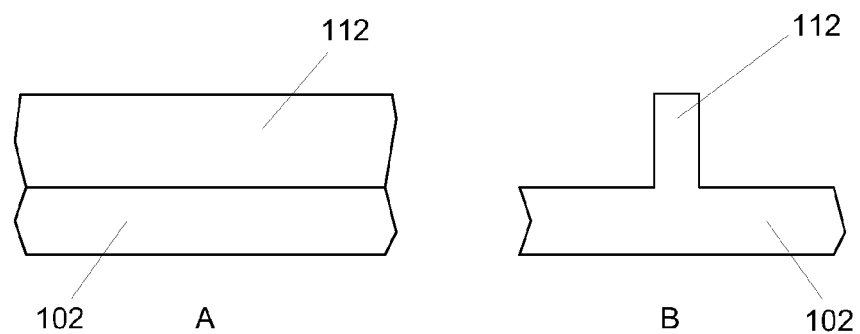
FIG. 2 illustrates a side cross-sectional view of a non-planar transistor fin formed in or on a microelectronic substrate.
Figure 3:
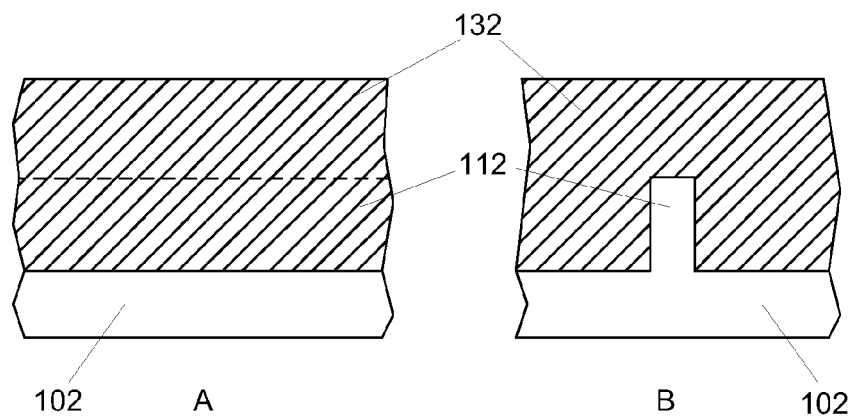
FIG. 3 illustrates a side cross-sectional view of a sacrificial material deposited over the non-planar transistor fin of FIG. 2, according to an embodiment of the present description.
Figure 4:
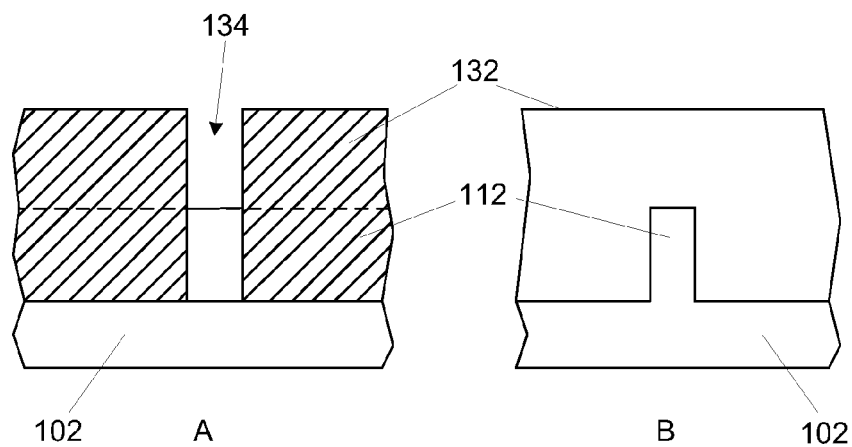
FIG. 4 illustrates a side cross-sectional view of a trench formed in the sacrificial material deposited to expose a portion of the non-planar transistor fin of FIG. 3, according to an embodiment of the present description.

As shown in FIG. 2, the non-planar transistor fin 112 may be formed by etching the microelectronic substrate 102 or by forming the non-planar transistor fin 112 on the microelectronic substrate 102 by any technique known in the art. As illustrate in FIG. 3, a sacrificial material 132 may be deposited over the non-planar transistor fin 112, as shown in FIG. 3, and a trench 134 may be formed in the sacrificial material 132 to expose a potion of the non-planar transistor fin 112, as shown in FIG. 4. The sacrificial material 132 may be any appropriate material known in the art, and the trench 134 may be formed by any technique known in the art, including but not limited to lithographic masking and etching.

Figure 5:
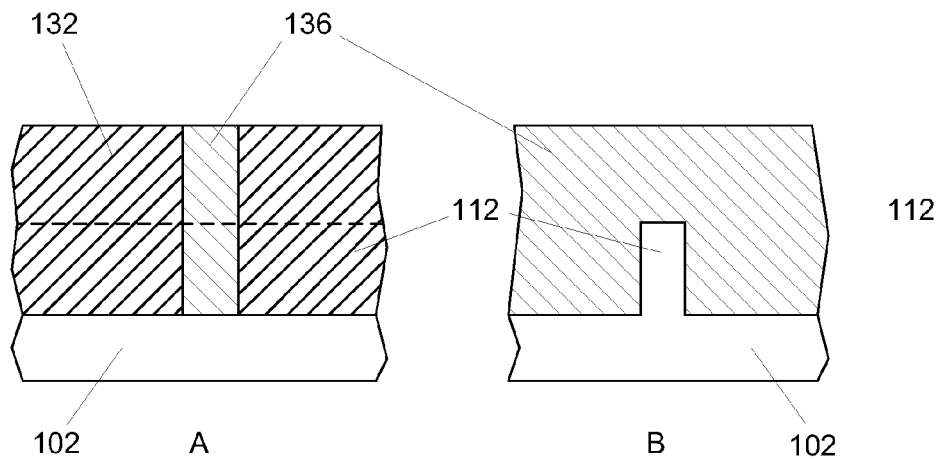
FIG. 5 illustrates a side cross-sectional view of a sacrificial gate formed in the trench of FIG. 4, according to an embodiment of the present description.

As shown in FIG. 5, a sacrificial gate 136 may be formed in the trench 134 (see FIG. 4). The sacrificial gate 136 may be any appropriate material, such as a polysilicon material and the like, and may be deposited in the trench 134 (see FIG. 4) by any technique known in the art, including but not limited to chemical vapor deposition ("CVD") and physical vapor deposition ("PVD").

Figure 6:
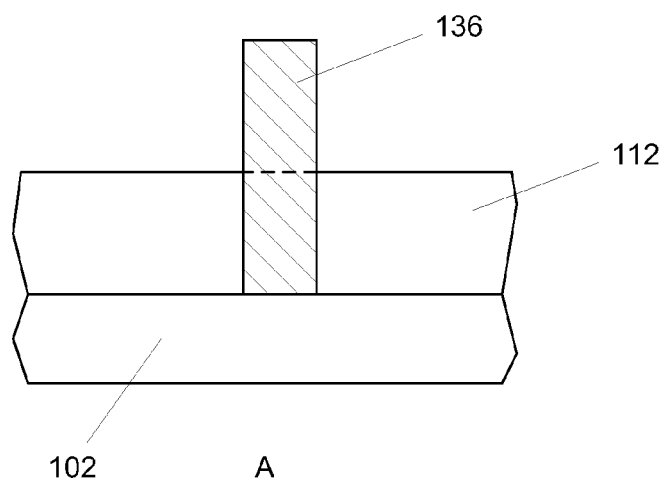
FIG. 6 illustrates a side cross-sectional view of the sacrificial gate after the removal of the sacrificial material of FIG. 5, according to an embodiment of the present description.
Figure 7:
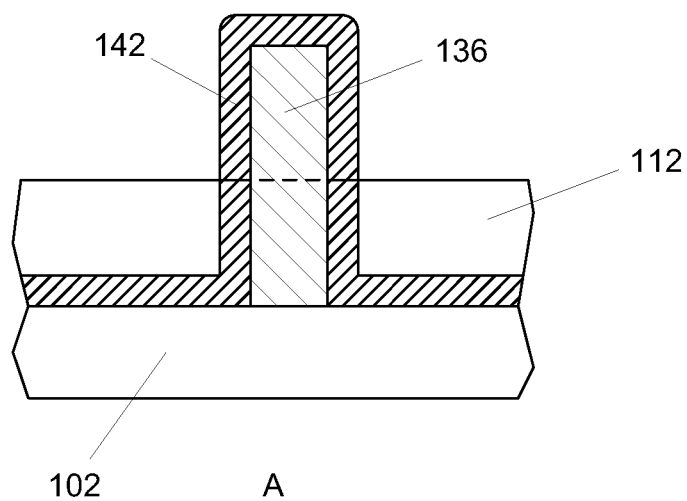
FIG. 7 illustrates a side cross-sectional view of a conformal dielectric layer deposited over the sacrificial gate and microelectronic substrate of FIG. 6, according to an embodiment of the present description.

As shown in FIG. 6, the sacrificial material 132 of FIG. 5 may be removed to expose the sacrificial gate 136 by any technique known in the art, such as selectively etching the sacrificial material 132. As shown in FIG. 7, a conformal dielectric layer 142 may be deposited over the sacrificial gate 136 and microelectronic substrate 102. The conformal dielectric layer 142 may be any appropriate material, including but not limited to silicon nitride ($Si_3N_4$) and silicon carbide (SiC), and may be formed by any appropriate technique including but not limited to atomic layer deposition ("ALD").

Figure 8:
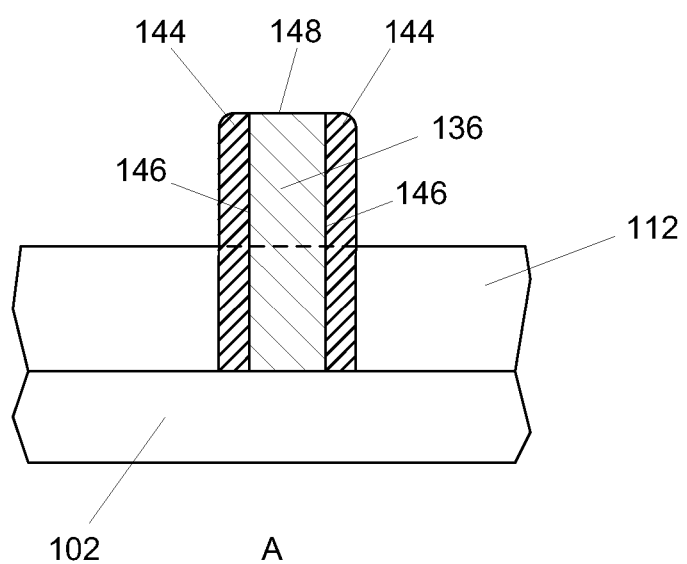
FIG. 8 illustrates a side cross-sectional view of gate spacers formed from the conformal dielectric layer of FIG. 7, according to an embodiment of the present description.

As shown in FIG. 8, the conformal dielectric layer 142 of FIG. 7 may be etched, such as by directional etch with an appropriate etchant, to form gate spacers 144 on sidewalls 146 of the sacrificial gate 136, while substantially removing the conformal dielectric material layer 142 adjacent the microelectronic substrate 102 and a top surface 148 of the sacrificial gate 136. It is understood that fin spacers (not shown) may be simultaneously formed on sidewalls 116 and 118 (see FIG. 1) of the non-planar transistor fin 112 during the formation of the gate spacers 144.

Figure 9:
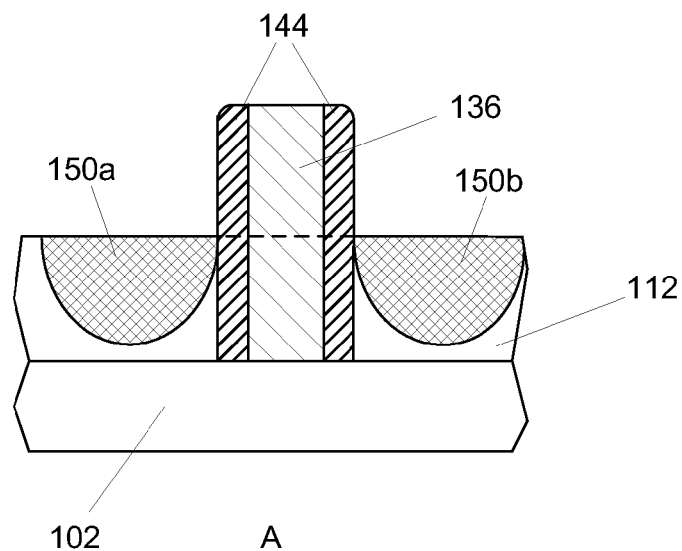
FIG. 9 illustrates a side cross-sectional view of a source region and a drain region formed in the non-planar transistor fin on either side of the gate spacers of FIG. 8, according to an embodiment of the present description.

As shown in FIG. 9, a silicon-containing source region 150a and a silicon-containing drain region 150b may be formed on either side of the gate spacers 144. In one embodiment, the silicon-containing source region 150a and the silicon-containing drain region 150b may be formed in the non-planar transistor fin 112 with the implantation of dopants. As will be understood to those skilled in that art, dopant implantation is a process of introducing impurities into semiconducting materials for the purpose changing its conductivity and electronic properties. This is generally achieved by ion implantation of either P-type ions (e.g. boron) or N-type ions (e.g. phosphorus), collectively referred to as "dopants". In another embodiment, portions of the non-planar transistor fin 112 may be removed by any technique known in the art, such as etching, and the silicon-containing source region 150a and a silicon-containing drain region 150b may be formed in place of the removed portions. The silicon-containing source region 150a and the silicon-containing drain region will hereinafter be referred to collectively as "silicon-containing source/drain region 150".

Figure 10:
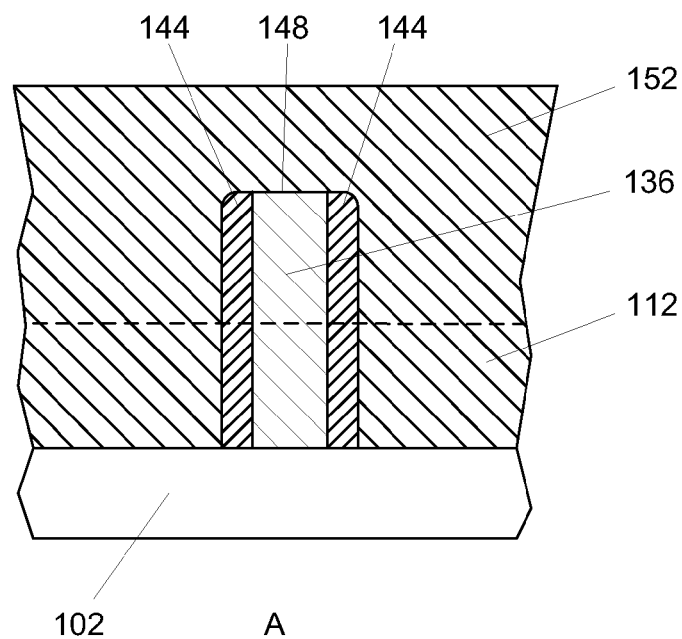
FIG. 10 illustrates a side cross-sectional view of a first dielectric material deposited over the gate spacers, the sacrificial gate, the non-planar transistor fin, and the microelectronic substrate of FIG. 9, according to an embodiment of the present description.
Figure 11:
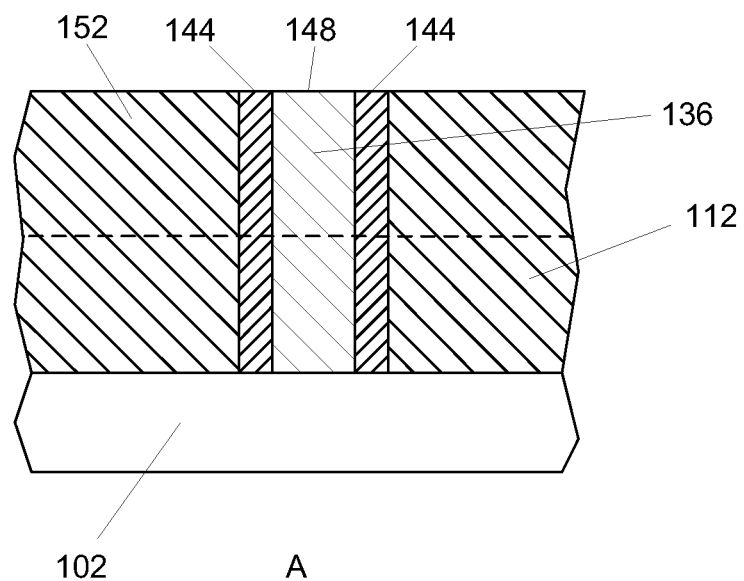
FIG. 11 illustrates a side cross-sectional view of the structure of FIG. 10 after planarizing the first dielectric material to expose a top surface of the sacrificial gate, according to an embodiment of the present description.

As shown in FIG. 10, a first dielectric material layer 152 may be deposited over the gate spacers 144, the sacrificial gate top surface 148, the non-planar transistor fin 112, and the microelectronic substrate 102. The first dielectric material layer 152 may be planarizing to expose the sacrificial gate top surface 148, as shown in FIG. 11. The planarization of the first dielectric material layer 152 may be achieved by any technique known in the art, including but not limited to chemical mechanical polishing (CMP).

Figure 12:
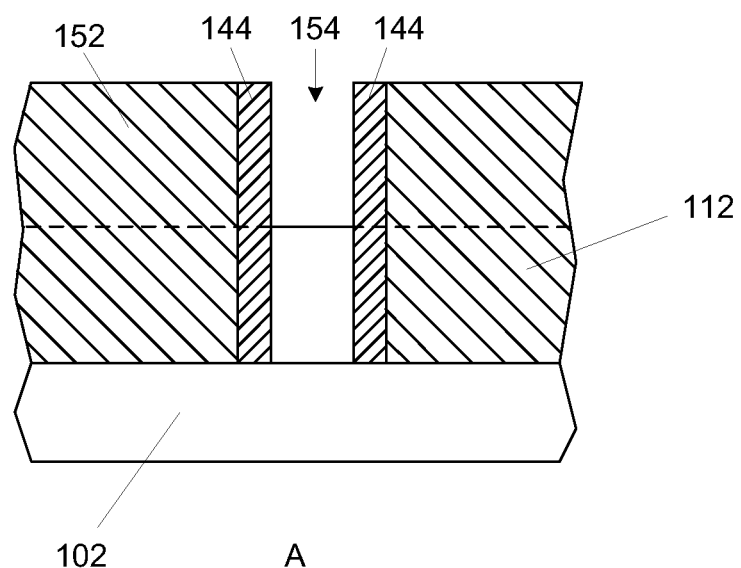
FIG. 12 illustrates a side cross-sectional view of the structure of FIG. 11 after the removal of the sacrificial gate to form a gate trench, according to an embodiment of the present description.
Figure 13:
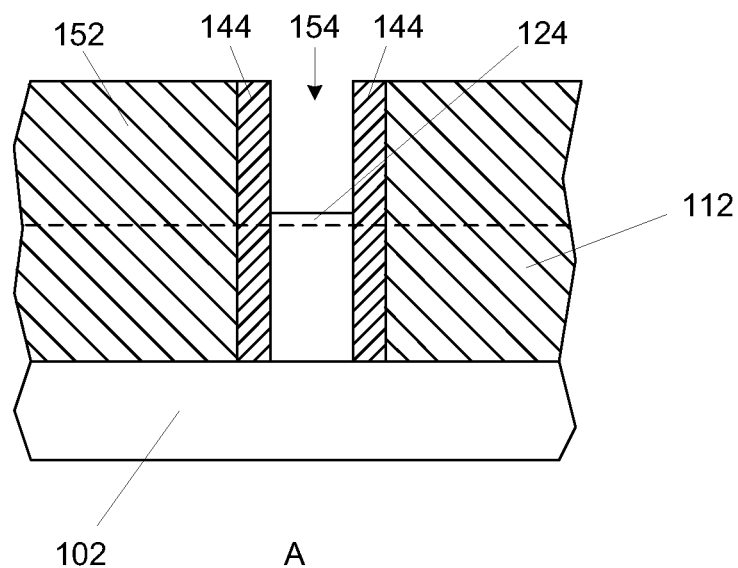
FIG. 13 illustrates a side cross-sectional view of the structure of FIG. 12 after the formation of a gate dielectric adjacent the non-planar transistor fin between the gate spacers, according to an embodiment of the present description.

As shown in FIG. 12, the sacrificial gate 136 of FIG. 11 may be removed to form a gate trench 154. The sacrificial gate 136 may be removed by any technique known in the art, such as a selective etch. As shown in FIG. 13, the gate dielectric layer 124, as also illustrated in FIG. 1, may be formed to abut the non-planar transistor fin 112, as previously discussed.

Figure 14:
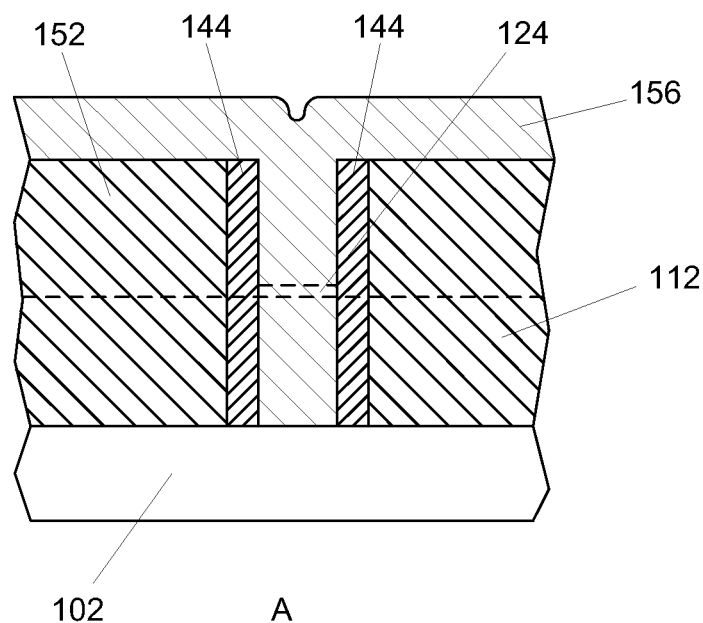
FIG. 14 illustrates a side cross-sectional view of a conductive gate material deposited in the gate trench of FIG. 13, according to an embodiment of the present description.
Figure 15:
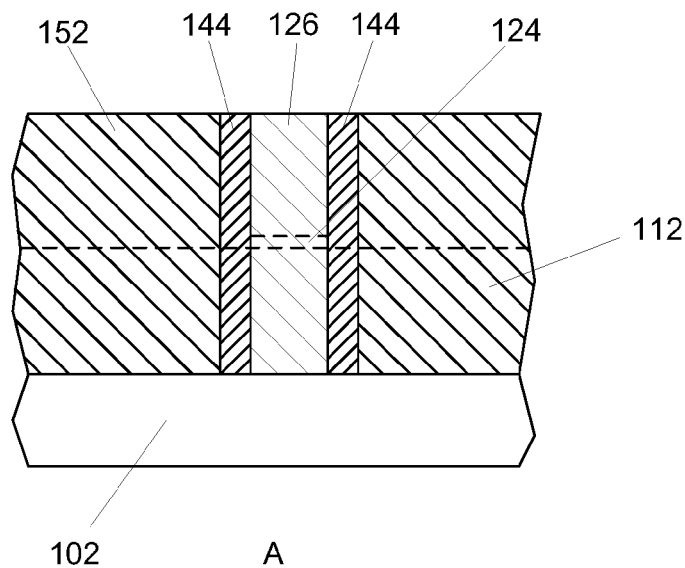
FIG. 15 illustrates a side cross-sectional view of the structure of FIG. 14 after the removal of excess conductive gate material to form a non-planar transistor gate, according to an embodiment of the present description.

As shown in FIG. 14, a conductive gate material 156 may be deposited in the gate trench 154, and excess conductive gate material 156 (e.g. conductive gate material 156 not within the gate trench 154 of FIG. 12) may be removed to from the non-planar transistor gate electrode 126 (see also FIG. 1), as shown in FIG. 15. The materials and methods of forming the gate electrode 126 have been previously discussed. The removal of the excess conductive gate material 156 may be achieved by any technique known in the art, including but not limited to chemical mechanical polishing (CMP), etching, and the like.

Figure 16:
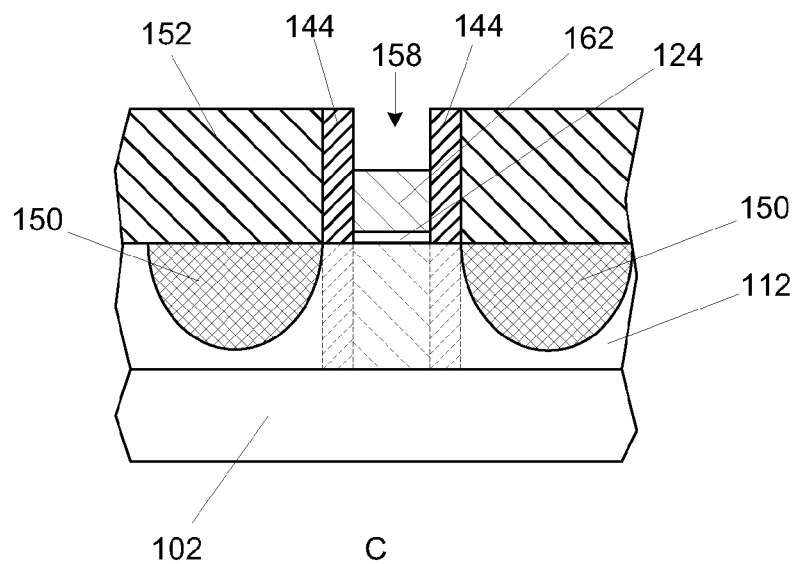
FIG. 16 illustrates a side cross-sectional view of the structure of FIG. 15 after etching away a portion of the non-planar transistor gate to form a recessed non-planar transistor gate, according to an embodiment of the present description.
Figure 17:
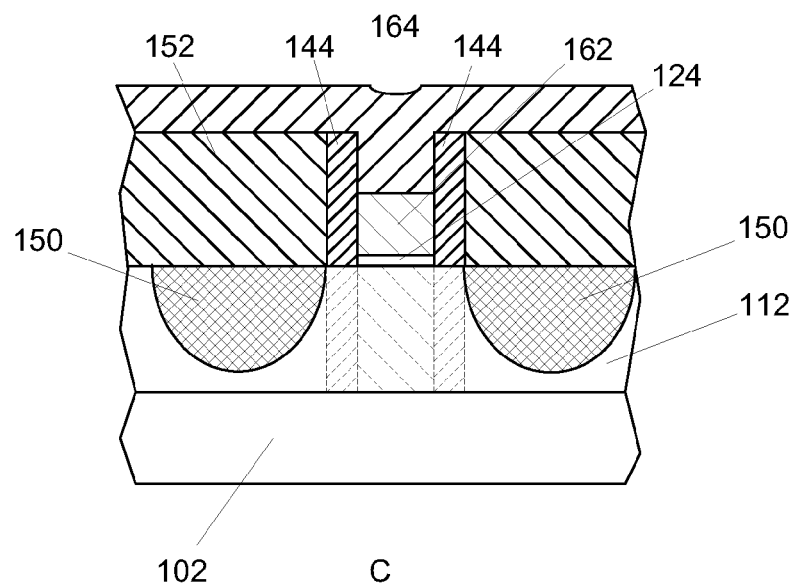
FIG. 17 illustrates a side cross-sectional view of the structure of FIG. 16 after depositing a capping dielectric material into the recess resulting from the formation of the recessed non-planar transistor gate, according to an embodiment of the present description.
Figure 18:
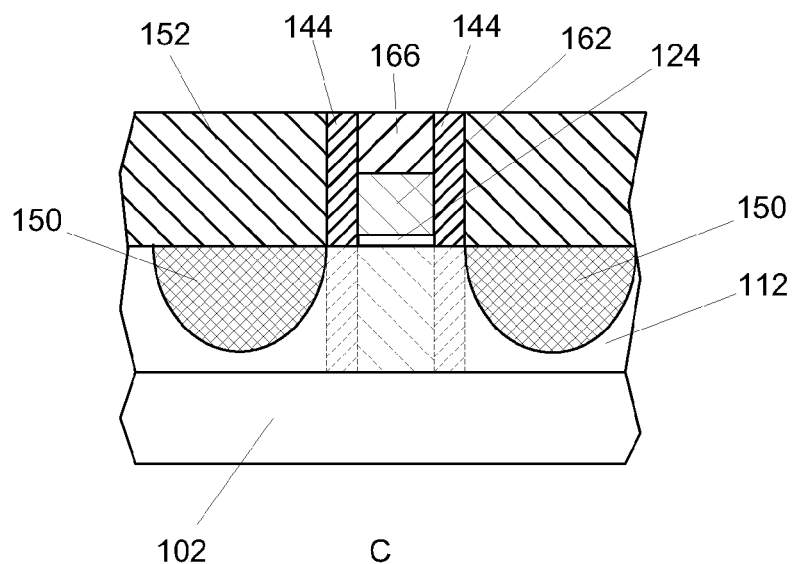
FIG. 18 illustrates a side cross-sectional view of the structure of FIG. 17 after the removal of excess capping dielectric material to form a capping structure on the non-planar transistor gate, according to an embodiment of the present description.

As shown in FIG. 16, a portion of the non-planar transistor gate electrode 126 may be removed to form a recess 158 and a recessed non-planar transistor gate 162. The removal may be accomplished by any known technique, including but not limited to wet or dry etching. As shown in FIG. 17, a capping dielectric material 164 may be deposited to fill the recess 158 of FIG. 16. The capping dielectric material 164 may be any appropriate material, including but not limited to silicon nitride ($Si_3N_4$) and silicon carbide (SiC), and may be formed by any appropriate deposition technique. The capping dielectric material 164 may be planarized to remove excess capping dielectric material 164 (e.g. capping dielectric material 164 not within the recess of FIG. 16) to from a capping structure 166 on the recessed non-planar transistor gate 162 and between a gate spacers 144, as shown in FIG. 18. The removal of the excess capping dielectric material 164 may be achieved by any technique known in the art, including but not limited to chemical mechanical polishing (CMP), etching, and the like.

Figure 19:
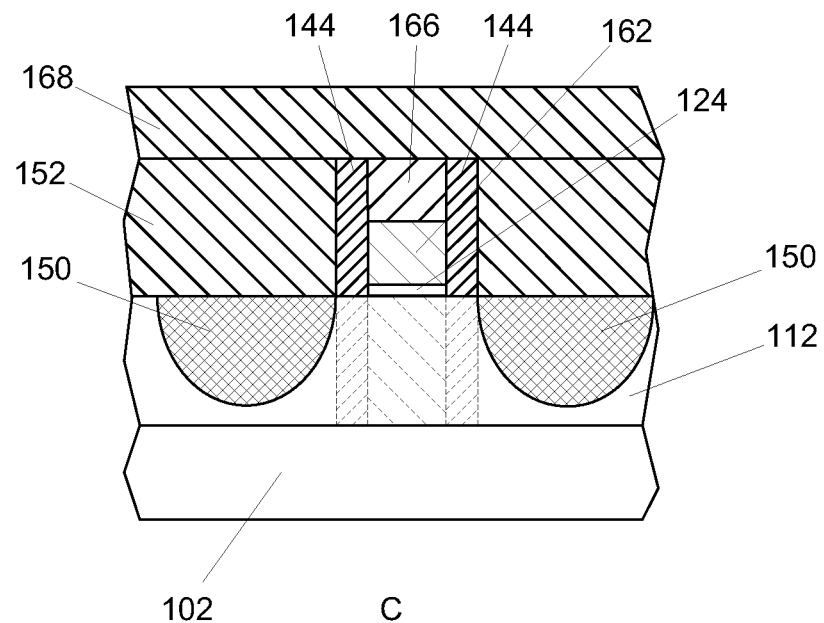
FIG. 19 illustrates a side cross-sectional view of a second dielectric material deposited over the first dielectric material layer, the gate spacers, and the sacrificial gate top surface of FIG. 18, according to an embodiment of the present description.
Figure 20:
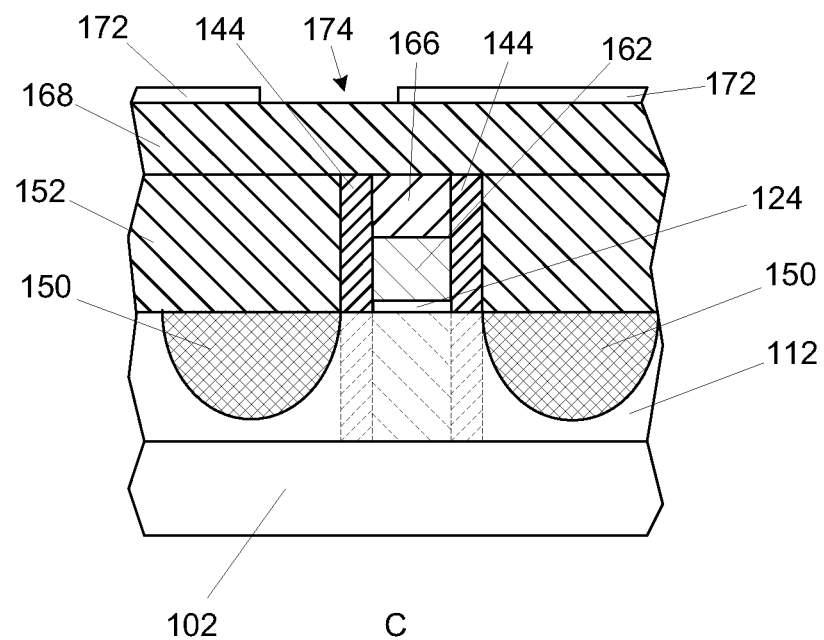
FIG. 20 illustrates a side cross-sectional view of an etch mask patterned on the second dielectric material of FIG. 19, according to an embodiment of the present description.

As shown in FIG. 19, a second dielectric material layer 168 may be deposited over the first dielectric material layer 152, the gate spacers 144, and the capping structure 166. The second dielectric material layer 168 may be formed from any appropriate dielectric material, including but not limited to silicon dioxide ($SiO_2$), silicon oxynitride ($SiO_xN_y$), and silicon nitride ($Si_3N_4$), by any known deposition technique. As shown in FIG. 20, an etch mask 172 may be patterned with at least one opening 174 on the second dielectric material layer 168, such as by well known lithographic techniques.

Figure 21:
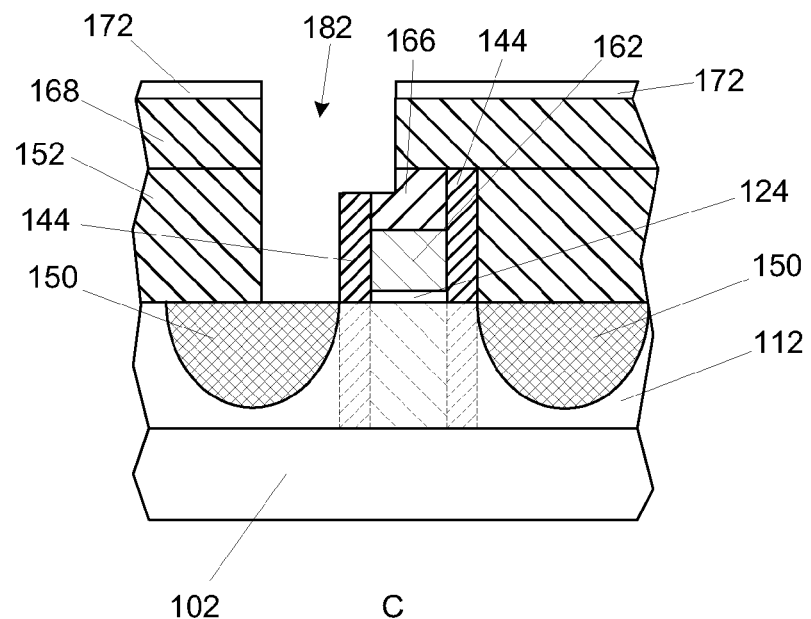
FIG. 21 illustrates a side cross-sectional view of a contact opening formed through the first and second dielectric material layer of FIG. 20, according to an embodiment of the present description.
Figure 22:
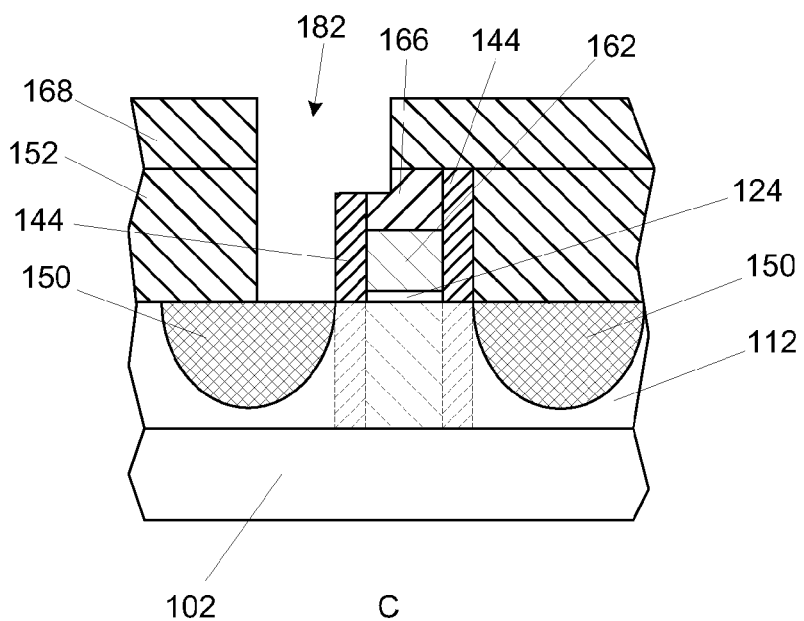
FIG. 22 illustrates a side cross-sectional view of the structure of FIG. 21 after the removal of the etch mask, according to an embodiment of the present description.

As shown in FIG. 21, a contact opening 182 may be formed through the first dielectric material layer 152 and the second dielectric material layer 168 by etching through the etch mask opening 174 of FIG. 20 to expose a portion of the source/drain region 150. The etch mask 172 of FIG. 21 may be removed thereafter, as shown in FIG. 22. In one embodiment, the first dielectric material layer 152 and the dielectric material layer 168 differs from dielectric material of both the gate spacers 144 and the capping structure 166, such that the etching of the first dielectric material layer 152 and the second dielectric layer 168 may be selective to the gate spacers 144 and the capping structure 166 (i.e. etches faster). This is known in the art as a self-aligning.

Figure 23:
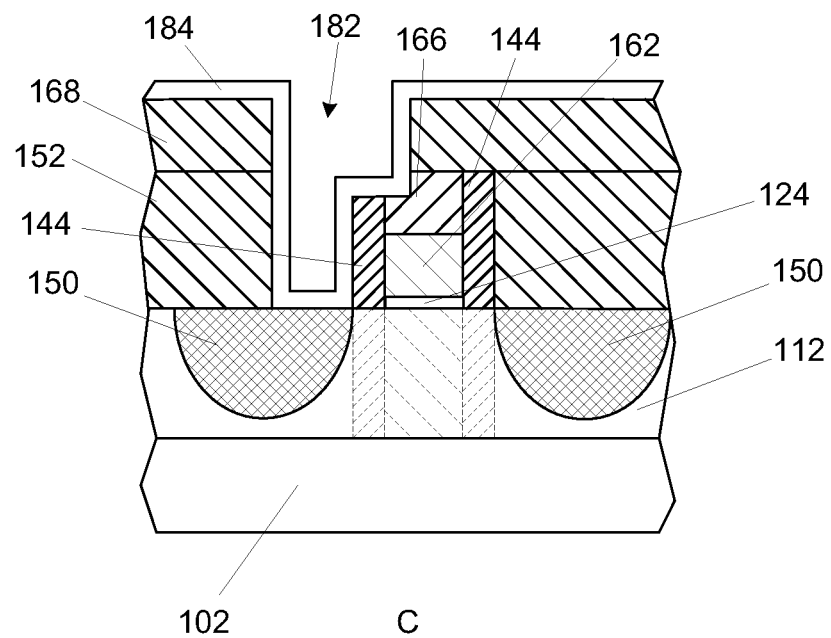
FIG. 23 illustrates a side cross-sectional view of a titanium-containing contact interface layer formed in the contact opening of FIG. 22, according to an embodiment of the present description.

As shown in FIG. 23, a titanium-containing contact interface layer 184 may be conformally deposited in the contact opening 182 to abut the exposed portion of the source/drain region 150, wherein the titanium-containing contact interface layer 184 acts as the primary work-function metal, as will be understood to those skilled in the art. In one embodiment, the titanium-containing contact interface layer 184 comprises substantially pure titanium. The titanium-containing contact interface layer 184 may be formed by atomic layer deposition.

Figure 24:
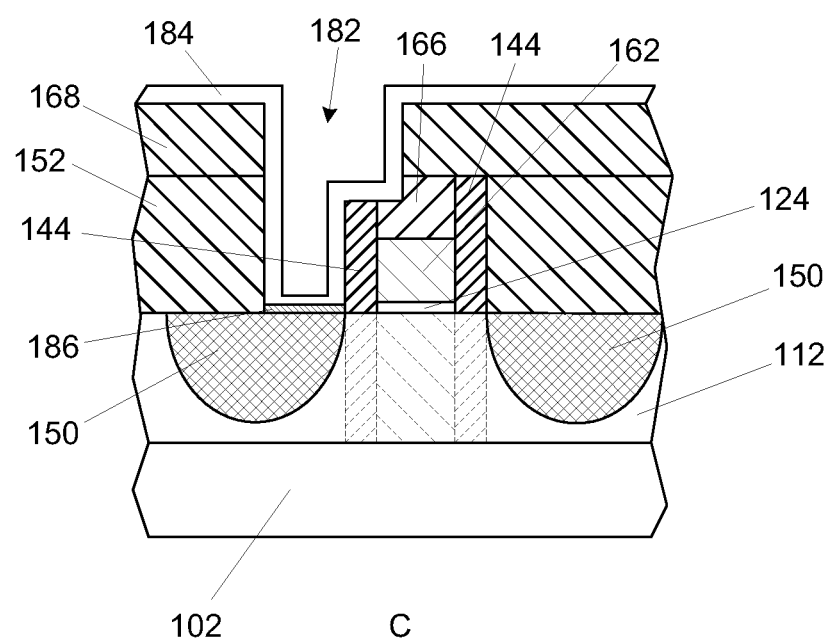
FIG. 24 illustrates a side cross-sectional view of a titanium silicide interface discretely formed between the titanium-containing contact interface layer and the source/drain region which has been formed in the non-planar transistor fin, according to an embodiment of the present description.

As shown in FIG. 24, a titanium silicide interface 186 may be discretely formed between the silicon-containing source/drain region 150 and the titanium-containing contact interface layer 184, such as by heating the structure of FIG. 23. The term "discretely" is defined to mean that titanium silicide is formed substantially only between the titanium-containing contact interface layer 184 and the silicon-containing source/drain region 150. The formation of the titanium silicide interface 186 may result in a low resistive contact, as will be understood to those skilled in the art.

Figure 25:
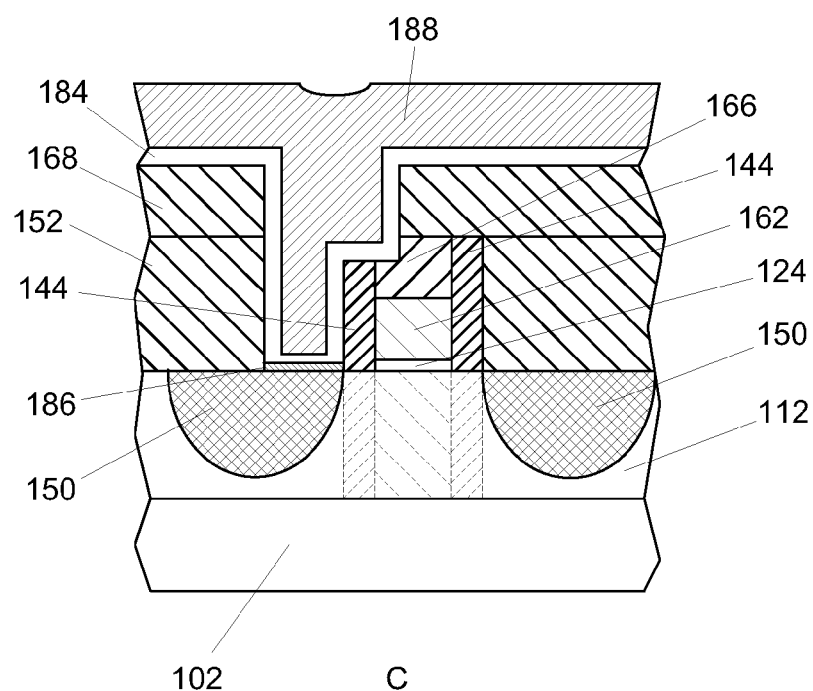
FIG. 25 illustrates a side cross-sectional view of a conductive contact material deposited in the contact opening of FIG. 24, according to an embodiment of the present description.

As shown in FIG. 25, a conductive contact material 188 may be deposited in the contact opening 182 of FIG. 24 to reside approximate the titanium-containing contact interface layer 184. In one embodiment, the conductive contact material 188 may be a tungsten-containing conductive material. In another embodiment, the conductive contact material 188 may be substantially pure tungsten.

Figure 26:
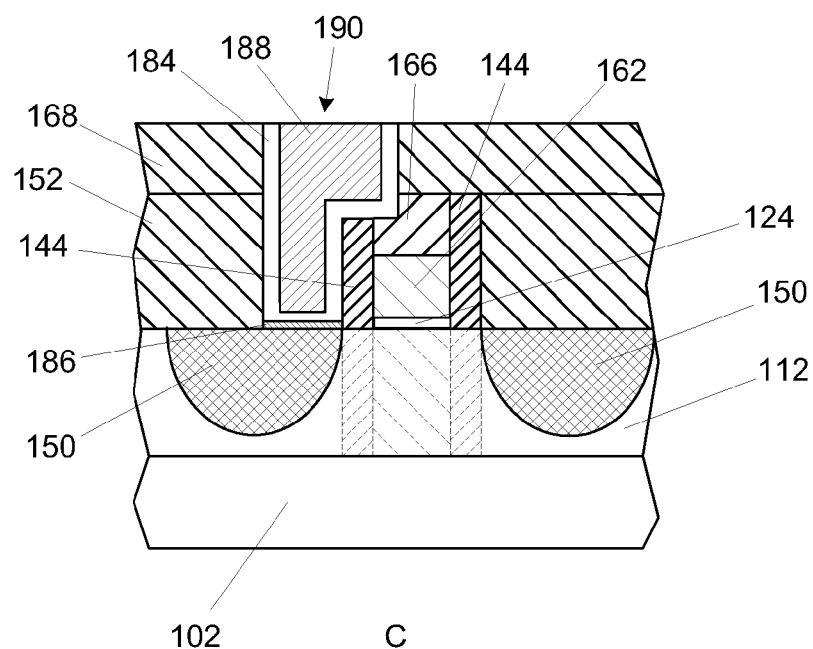
FIG. 26 illustrates a side cross-sectional view of the structure of FIG. 25 after the removal of the excess conductive contact material to form a source/drain contact, according to an embodiment of the present description.

As shown in FIG. 26, excess conductive contact material 188 of FIG. 25 (e.g. conductive contact material 188 not within the contact opening 182 of FIG. 12) to form a source/drain contact 190. The removal of the excess conductive contact material 188 may be achieved by any technique known in the art, including but not limited to chemical mechanical polishing (CMP), etching, and the like.

As previously discussed, in one embodiment, the first dielectric material layer 152 and the dielectric material layer 168 differs from dielectric material of both the gate spacers 144 and the capping structure 166, such that the etching of the first dielectric material layer 152 and the second dielectric layer 168 may be selective to the gate spacers 144 and the capping structure 166 (i.e. etches faster). Thus, the recessed non-planar transistor 162 is protected during the formation of the contact opening 182. This allows for the formation of a relatively large sized source/drain contact 190, which may increase the transistor drive current performance, without the risk of shorting between the source/drain contact 190 and the recessed non-planar transistor gate 162.

The use of the titanium-containing contact interface layer 184 may eliminate the conventional use of fully silicided nickel-containing contact interface layers, such nickel silicide and platinum nickel silicide. Nickel is a highly mobile element which tends to rapidly diffuse outside of an intended contact area. Such diffusion may result in source/drain shorts, as will be understood to those skilled in the art. Further, the use of the titanium-containing contact interface layer 184 may eliminate the need for a silicide pre-clean step, which may reduce the chance of having shorting between source/drain contact 190 and the recessed non-planar transistor gate 162, as previously discussed, as such a pre-clean step may remove material from the capping structure 166 and/or the gate spacers 144.

It is understood that the subject matter of the present description is not necessarily limited to specific applications illustrated in FIGS. 1-26. The subject matter may be applied to other microelectronic device fabrication applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic device, comprising:
   a silicon-containing non-planar transistor fin;
   a source/drain region in the silicon-containing non-planar fin;
   a source/drain contact adjacent the source/drain region, wherein the source/drain contact comprises a conductive contact material and a titanium-containing contact interface layer disposed between conductive contact material and the source/drain region;
   a titanium silicide interface disposed between the source/drain region and the titanium-containing contact interface layer; and
   a non-planar transistor gate over the non-planar transistor fin, wherein the non-planar transistor gate comprises a gate electrode recessed between gate spacers and a capping structure disposed on the recessed gate electrode between the gate spacers, and wherein the titanium-containing contact interface layer abuts at least a portion of one non-planar transistor gate spacer and/or abuts at least a portion of the capping structure.

2. The microelectronic device of claim 1, wherein the conductive contact material comprises tungsten.

3. The microelectronic device of claim 1, wherein the titanium silicide interface resides substantially only between the source/drain region and the titanium-containing contact interface layer.

4. A method of fabricating a microelectronic device, comprising:
   forming a silicon-containing non-planar transistor fin;
   forming a source/drain region in the silicon-containing non-planar fin;
   forming a dielectric material over the source/drain region;
   forming a contact opening through the dielectric material to expose a portion of the source/drain region;
   conformally depositing a titanium-containing contact interface layer within the contact opening to abut the source/drain region;
   depositing a conductive contact material within the contact opening to abut the titanium-containing contact interface layer; and
   forming a titanium silicide interface between the source/drain region and the titanium-containing contact interface layer.

5. The method of claim 4, wherein conformally depositing the titanium-containing contact interface layer comprises depositing a substantially pure titanium contact interface layer.

6. The method of claim 4, wherein depositing a conductive contact material within the contact opening comprises depositing tungsten within the contact opening.

7. The method of claim 4, wherein forming the titanium silicide interface between the source/drain region and the titanium-containing contact interface layer comprises forming the titanium silicide interface between the source/drain region and the titanium-containing contact interface layer by heating the source/drain region and the titanium-containing contact interface layer.

8. The method of claim 4, wherein forming the titanium silicide interface comprises forming the titanium silicide substantially only between the source/drain region and the titanium-containing contact interface layer.

9. The method of claim 4, wherein forming the non-planar transistor gate comprises forming gate spacers, forming a gate electrode recessed between the gate spacers and disposing a capping structure on the recessed gate electrode between the gate spacers.

10. The method of claim 9, wherein forming a contact opening through the dielectric material to expose at least a portion of the source/drain region further comprises forming a contact opening through the dielectric material to expose a portion of the source/drain region and at least a portion of one non-planar transistor gate spacer.

11. The method of claim 10, wherein forming the titanium-containing contact interface layer further comprises forming the titanium-containing contact interface layer to abut at least a portion of one non-planar transistor gate spacer.

12. The method of claim 9, wherein forming a contact opening through the dielectric material to expose at least a portion of the source/drain region further comprises forming a contact opening through the dielectric material to expose a portion of the source/drain region and at least a portion of the capping structure.

13. The method of claim 12, wherein the forming the titanium-containing contact interface layer further comprises forming the titanium-containing contact interface layer to abut at least a portion of the capping structure.

14. A microelectronic device, comprising:
a silicon-containing non-planar transistor fin;
a source/drain region in the silicon-containing non-planar fin;
a source/drain contact adjacent the source/drain region, wherein the source/drain contact comprises a conductive contact material and a titanium-containing contact interface layer disposed between conductive contact material and the source/drain region, wherein the titanium-containing contact interface layer comprises substantially pure titanium;
a titanium silicide interface disposed between the source/drain region and the titanium- containing contact interface layer; and
a non-planar transistor gate over the non-planar transistor fin, wherein the non-planar transistor gate comprises a gate electrode recessed between gate spacers and a capping structure disposed on the recessed gate electrode between the gate spacers, and wherein the titanium-containing contact interface layer abuts at least a portion of one non-planar transistor gate spacer and/or abuts at least a portion of the capping structure.

15. The microelectronic device of claim 14, wherein the conductive contact material comprises tungsten.

16. The microelectronic device of claim 14, wherein the titanium silicide interface resides substantially only between the source/drain region and the titanium-containing contact interface layer.

* * * * *

UNITED STATES PATENT AND TRADEMARK OFFICE
CERTIFICATE OF CORRECTION

PATENT NO. : 9,853,156 B2  
APPLICATION NO. : 14/618414  
DATED : December 26, 2017  
INVENTOR(S) : Sameer S. Pradhan, Subhash M. Joshi and Jin-Sung Chun Page 1 of 1

It is certified that error appears in the above-identified patent and that said Letters Patent is hereby corrected as shown below:

In the Claims

In Column 8, Line 21, replace "...interface layer disposed between conductive contact..." with --interface layer disposed between the conductive contact--

In Column 10, Line 10, replace "...interface layer disposed between conductive contact..." with --interface layer disposed between the conductive contact--

Signed and Sealed this  
Fourteenth Day of December, 2021

Drew Hirshfeld  
*Performing the Functions and Duties of the*  
*Under Secretary of Commerce for Intellectual Property and*  
*Director of the United States Patent and Trademark Office*